(12) United States Patent
Kim et al.

(10) Patent No.: US 7,230,293 B2
(45) Date of Patent: Jun. 12, 2007

(54) STORAGE NODES OF A SEMICONDUCTOR MEMORY

(75) Inventors: Sang-yong Kim, Yongin (KR); Kun-tack Lee, Suwon (KR); Yong-pil Han, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 117 days.

(21) Appl. No.: 11/061,215

(22) Filed: Feb. 18, 2005

(65) Prior Publication Data

US 2005/0142884 A1 Jun. 30, 2005

Related U.S. Application Data

(62) Division of application No. 10/434,052, filed on May 8, 2003, now Pat. No. 6,903,024.

(30) Foreign Application Priority Data

Jul. 25, 2002 (KR) ................................ 2002-43898

(51) Int. Cl.
*H01L 31/119* (2006.01)
*H01L 21/302* (2006.01)

(52) U.S. Cl. ..................................... 257/311; 438/704
(58) Field of Classification Search ................ 438/637, 438/672, 704, 745; 257/304, 311, 330–332
See application file for complete search history.

(56) References Cited

U.S. PATENT DOCUMENTS

| 5,162,248 A | * | 11/1992 | Dennison et al. | ........... 438/396 |
| 5,763,306 A | * | 6/1998 | Tsai | ........................... 438/255 |
| 6,248,624 B1 | * | 6/2001 | Liu | ............................. 438/253 |

* cited by examiner

*Primary Examiner*—Calvin Lee
(74) *Attorney, Agent, or Firm*—F.Chau & Associates, LLC

(57) ABSTRACT

A semiconductor memory device is provided, including a substrate and storage nodes formed on the substrate from a silicon oxide layer, the layer having been substantially removed by wet etching the silicon oxide layer to a predetermined depth of the storage nodes and dry etching the remaining portion of the silicon oxide layer to expose the storage nodes.

20 Claims, 8 Drawing Sheets

STORAGE NODES OF A SEMICONDUCTOR MEMORY

CROSS-REFERENCE TO RELATED APPLICATION

This application is a divisional of U.S. patent application Ser. No. 10/434,052 (Attorney Docket No. 8021-150 (SS-17626-US)), filed May 8, 2003 now U.S. Pat. 6,903,024 and entitled "METHOD OF MANUFACTURING STORAGE NODES OF A SEMICONDUCTOR MEMORY DEVICE USING A TWO-STEP ETCHING PROCESS", which is incorporated herein by reference in its entirety.

BACKGROUND OF THE INVENTION

1. Field of the Invention

The present invention relates to a method of manufacturing a semiconductor memory device, and more particularly, to a method of manufacturing storage nodes of a semiconductor memory device.

2. Description of the Related Art

As semiconductor memory devices become more highly integrated, the sizes, structures and methods of fabricating the devices are continually changing. For example, a method of separating devices using trenches is widely used, and the sizes and the structures of components such as gate electrodes, contacts and capacitors have changed. In addition, capacitors have changed from two-dimensional structures into three-dimensional structures. Here, due to the increase in the integration of semiconductor memory devices, the areas of the capacitors have been reduced while the heights of the capacitors have been increased.

With the area of capacitors being continuingly reduced, various methods have been suggested to secure the large capacitance required by the semiconductor memory devices. A prime example of these methods is increasing the volume of the capacitors. In order to increase the volume of the capacitors, three-dimensional capacitors are formed or a layer of hemispherical grains is formed on the surfaces of capacitor electrodes. Further, increasing the height of storage nodes has also been suggested.

The thickness of a sacrificial oxide layer, such as a mold oxide layer used to form the storage nodes, is increased due to the increase in the height of the storage nodes. In addition to the problem of depositing the sacrificial oxide layer in a thick and uniform manner, there is also a problem with removing the sacrificial oxide layer after the storage nodes have been manufactured. Removing the sacrificial oxide layer was not a serious problem when the heights of the storage nodes were not very high. However, as the heights of the storage nodes increase, removing the sacrificial oxide layer becomes more problematic.

FIG. 1 is a flowchart illustrating a conventional method of manufacturing storage nodes of a semiconductor memory device. In the method of FIG. 1, an etch stopping layer and a mold oxide layer are sequentially deposited on a substrate or an interlevel insulating layer to form storage nodes in step S11. Thereafter, the mold oxide layer is patterned to define a region where the storage nodes are to be formed and exposed portions of the etch stopping layer are removed in step S12. Next, a conductive layer is deposited on a storage node region and the mold oxide layer to a predetermined thickness in step S13. A buffer oxide layer is thickly deposited on the conductive layer in step S14. The buffer oxide layer and the conductive layer are etched using chemical mechanical polishing ("CMP") or a dry etchback method to separate nodes of the conductive layer in step S15, thus completing the storage nodes.

Thereafter, the mold oxide layer and the buffer oxide layer, which surround the conductive layer, are removed altogether in step S16. Here, the mold oxide layer and the buffer oxide layer are removed in a batch type by wet etching. Wet etching is performed using a buffered oxide etchant ("BOE") solution or a hydrogen fluoride ("HF") solution. After silicon oxide layers are removed by wet etching, a rinse and drying process is performed in step S17.

In the case where the thick layers are removed by wet etching due to the increase in the heights of the storage nodes, bridges are likely to occur between adjacent storage nodes. In other words, the storage nodes can fall onto adjacent storage nodes, and short circuits can occur. One reason why the storage nodes fall is because of the presence of water between the surfaces of adjacent storage nodes. Here, water remains between storage nodes after a wet etching process or a rinse process.

Bridges of the storage nodes due to the presence of water will now be described with reference to FIG. 2. As shown in FIG. 2, when a water film 20 forms between two storage nodes 16a, two forces are present and exerted on the storage nodes 16a. Here, the two forces include surface tension $F_s$, which tries to pull adjacent storage nodes 16a, and a shear and bending force $F_e$, which acts in the opposite direction to the surface tension $F_s$.

It is assumed that cylindrical storage nodes are formed in a rectangular parallelepiped structure while being firmly attached to a substrate 10 as rigid beams. In this case, the shear and bending force $F_e$ can be represented by Equation 1.

$$F_e = \frac{3 \cdot E \cdot I \cdot x}{H^3} \quad (1)$$

Here, E denotes Young's modulus, I denotes the moment of inertia of a horizontal cross section, H denotes the height of the storage nodes, and x denotes a deformation distance.

The surface tension $F_s$ can be represented by Equation 2.

$$F_s = 2 \cdot v \cdot \sin\theta \cdot (L+H) \quad (2)$$

Here, v denotes the surface tension coefficient of water, $\theta$ denotes the contact angle between a storage node and water, and L denotes the distance of one side of the storage node.

At equilibrium, the forces have the same magnitudes. Thus, the deformation distance can be represented as shown in Equation 3 by combining Equations 1 and 2.

$$x = \frac{2 \cdot v \cdot \sin\theta \cdot (L+H) \cdot H^3}{3 \cdot E \cdot I} \quad (3)$$

Referring to Equation 3, the deformation distance x is proportional to the height H of the storage nodes.

On the other hand, as represented by Equation 4, the possibility of the storage nodes falling is proportional to the deformation distance x and inversely proportional to the distance D between the storage nodes. Here, since the deformation distance x is proportional to the height H of the storage nodes, the possibility of the storage nodes falling is proportional to the height H of the storage nodes and inversely proportional to the distance D between the storage nodes. Accordingly, as the design rule is reduced and the height of the capacitors is increased, the possibility of the storage nodes falling is increased.

$$\text{possibility of adhesion} \propto \frac{\text{deformation distance of storage node } (x)}{\text{distance between storage nodes } (D)} \quad (4)$$

Turning to FIG. 3, the reference numeral 300 generally indicates a scanning electron microscope ("SEM") photograph illustrating the fallen state of two storage nodes 312 and 314 in the case where the height of the storage nodes is about 18,000 Å and the distance between the storage nodes in a row direction is about 700 Å. Here, the photograph is taken from above the storage nodes 310, 312, 314 and 316. The SEM photograph of FIG. 3 is taken after the oxide layers, i.e., the mold oxide layer and the buffer oxide layer, have been removed by the conventional BOE solution and the rinse and drying processes have been performed. The circle denotes the two fallen storage nodes.

Typically, a dryer is used for the drying process after the oxide layers have been removed by wet etching. The likelihood of storage nodes falling generally varies according to the type of dryer used and its performance. Since the design rule is continuingly decreased, it is generally desirable to decrease the distances between the storage nodes and to increase the heights of the storage nodes. Since the performance of the dryer is ultimately limited, there is a corresponding limitation in the ability to prevent the storage nodes from falling merely by improving the performance of the dryer. Accordingly, what is needed is an improvement over the conventional wet etching method that does not depend on the performance of a dryer.

SUMMARY OF THE INVENTION

The present invention provides a method of manufacturing storage nodes of a semiconductor memory device such that short circuits due to fallen adjacent storage nodes can be prevented with processes performed efficiently.

According to one aspect of the present invention, there is provided a method of manufacturing storage nodes of a semiconductor memory device. In the method, a silicon oxide layer including storage nodes is formed on a substrate or on an interlevel insulating layer. The silicon oxide layer is wet etched to a predetermined depth of the storage nodes. Thereafter, the remaining portion of the silicon oxide layer is dry etched and removed to expose the storage nodes completely. Here, the storage nodes may be formed of polysilicon or metal.

When dry etching is performed after wet etching, a rinse and drying process is not necessary, so water does not present on the sidewalls of the storage nodes. Accordingly, the falling of the storage nodes can be prevented. When dry etching is performed after wet etching, a throughput is increased compared to the case of performing only dry etching. In addition, when dry etching is performed after wet etching, a process is simplified not to reduce the throughput compared to the case of performing wet etching.

It is preferable that the dry etching is performed using a volatile material as a catalyst, such as an alcohol-based material or a carboxyl-based material. Here, the volatile material improves disassociation of hydrogen fluoride gas and removes water and impurities.

According to another aspect of the present invention, there is provided a method of manufacturing storage nodes of a semiconductor memory device. In the method, a silicon oxide layer including cylindrical storage nodes is formed on a substrate. The silicon oxide layer is wet etched to a predetermined depth of the storage nodes using a buffered oxide etchant ("BOE") solution or a hydrogen fluoride ("HF") solution. Thereafter, the remaining portion of the silicon oxide layer is removed by dry etching using a mixed gas of anhydrous HF, isopropyl alcohol ("IPA"), and vapor. Here, the wet etching is performed to a depth that does not cause adjacent storage nodes to fall. In the dry etching, IPA operates as a catalyst.

It is preferable that the dry etching is performed at a temperature range of about 0 to about 60° C., the flow rate of anhydrous HF is in the range of about 100 to about 2,000 sccm, and the flow rate of IPA is in the range of about 50 to about 200 sccm.

According to another aspect of the present invention, there is provided a method of forming storage nodes of a semiconductor memory device. In the method, an etch stopping layer and a mold oxide layer are sequentially deposited on an interlevel insulating layer including storage node contact plugs. The mold oxide layer and the etch stopping layer are sequentially etched to define a storage node region. Thereafter, a conductive layer is deposited on the storage node region and the mold oxide layer, and a buffer oxide layer is deposited on the conductive layer. The buffer oxide layer and the conductive layer are etched to form storage nodes by separating nodes of the conductive layer. The buffer oxide layer and the mold oxide layer are wet etched to a predetermined depth of the storage nodes, and the remaining portions of the buffer oxide layer and the mold oxide layer are removed by dry etching to expose the storage nodes completely. Herein, the wet etching is performed to a depth that does not cause adjacent storage nodes to fall.

According to still another aspect of the present invention, there is provided a method of forming storage nodes of a semiconductor memory device. In the method, an etch stopping layer and a mold oxide layer are sequentially deposited on an interlevel insulating layer including storage node contact plugs, and the mold oxide layer and the etch stopping layer are sequentially etched to define a cylindrical storage node region. Thereafter, a conductive layer is deposited on the storage node region and the mold oxide layer, and a buffer oxide layer is deposited on the conductive layer. The buffer oxide layer and the conductive layer are etched to form storage nodes by separating nodes of the conductive layer. Next, the buffer oxide layer and the mold oxide layer are wet etched to a predetermined depth of the storage nodes using a BOE solution or a HF solution. The remaining portions of the buffer oxide layer and the mold oxide layer are removed by dry etching using a mixed gas of anhydrous HF, IPA, and vapor, to expose the storage nodes completely. Here, the wet etching is performed to a depth that does not cause adjacent storage nodes to fall.

The method may further comprise annealing the etch stopping layer after dry etching in order to prevent impurities from remaining on the etch stopping layer when the etch stopping layer is damaged by the dry etching. It is preferable that the annealing is performed at a temperature of about 200 to about 300° C.

BRIEF DESCRIPTION OF THE DRAWINGS

The above aspects and advantages of the present invention will become more apparent by describing in detail preferred embodiments thereof with reference to the attached drawings, in which.

DETAILED DESCRIPTION OF PREFERRED EMBODIMENTS

Figure 1:
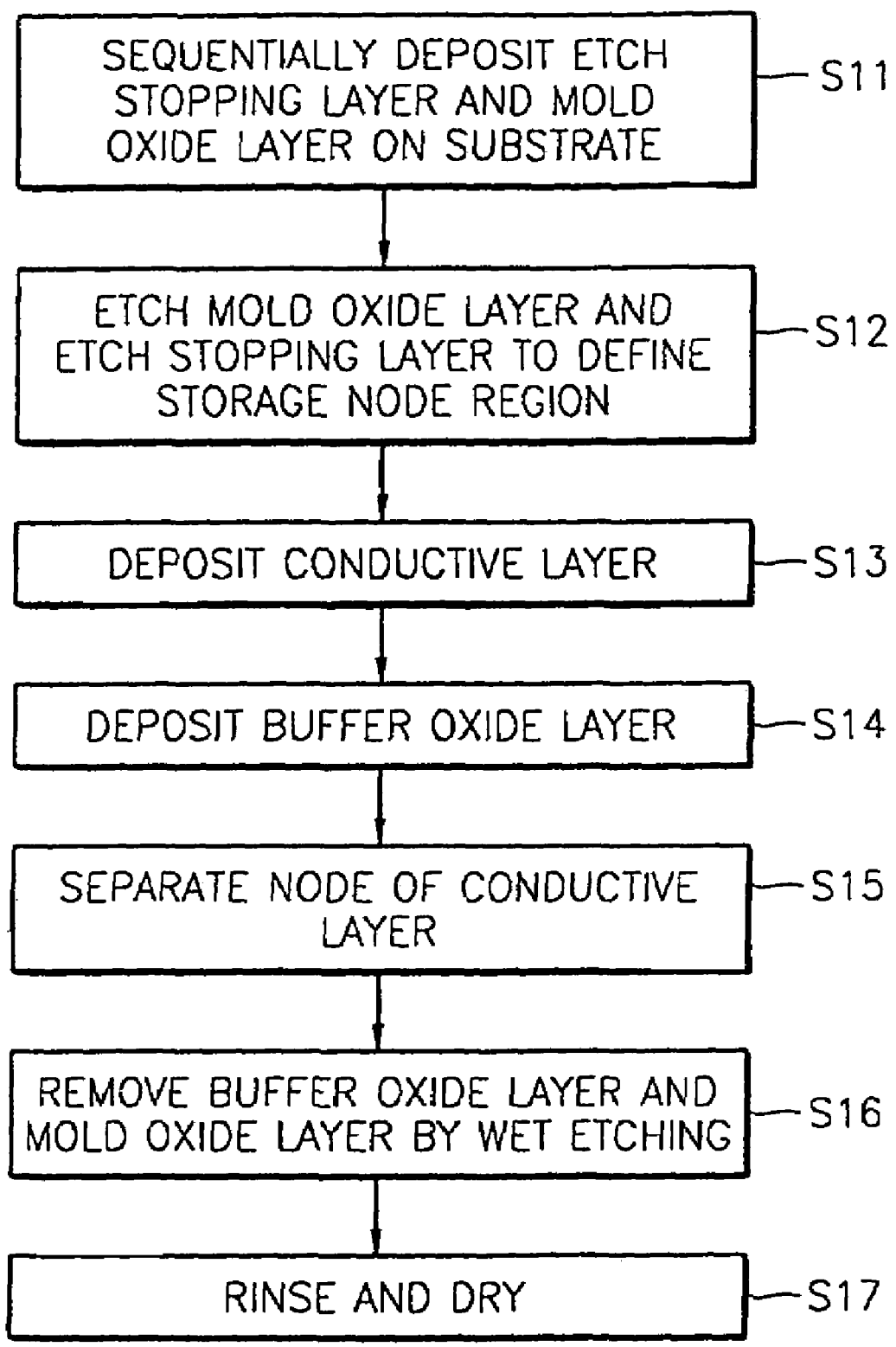
FIG. 1 is a flowchart illustrating a conventional method of manufacturing storage nodes of a semiconductor memory device.
Figure 2:
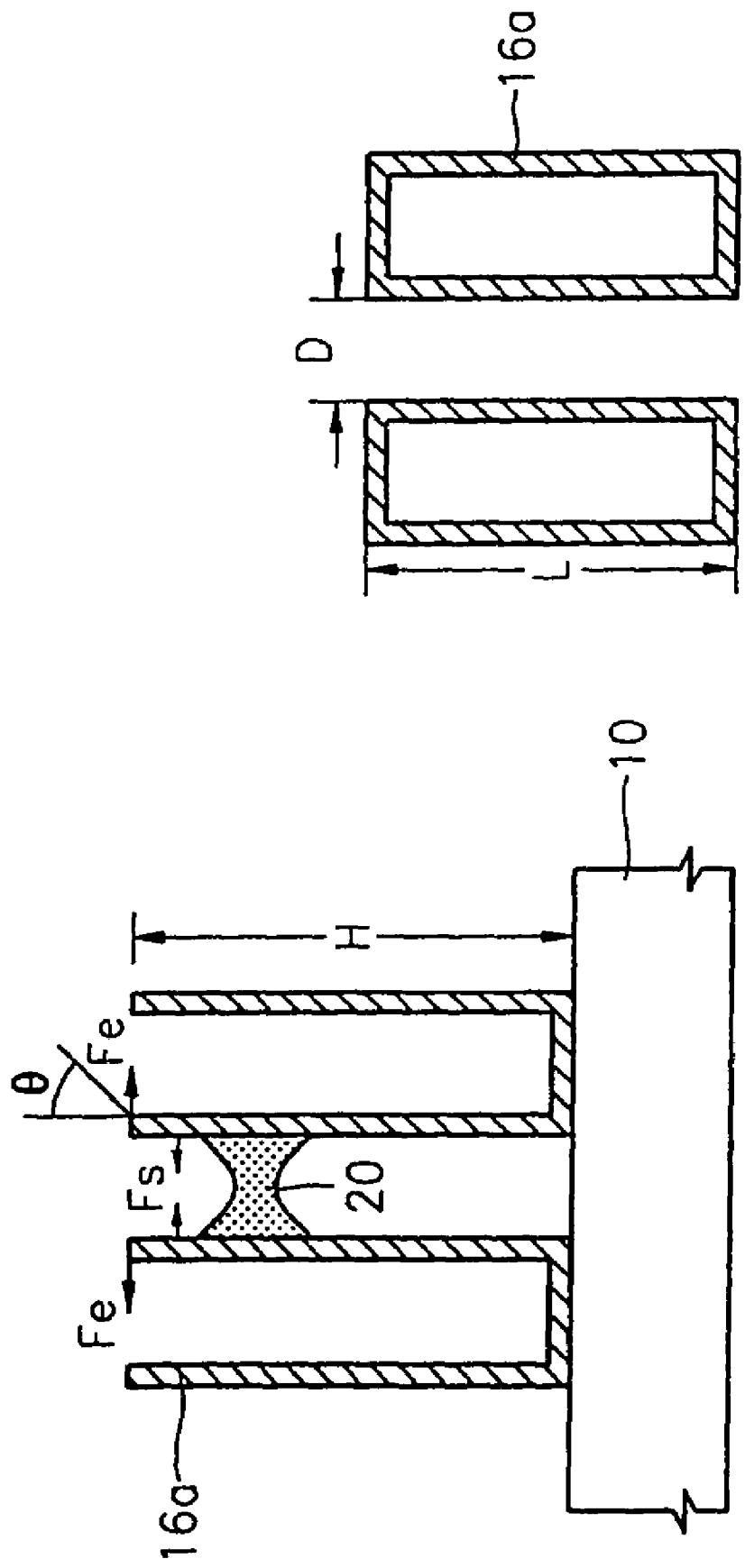
FIG. 2 is a schematic diagram for explaining the possibility of the storage nodes falling due to remaining water film.

The present invention will now be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete and will fully convey the concept of the invention to those skilled in the art. In the drawings, the thicknesses of layers and regions may be exaggerated for clarity. It will also be understood that when a layer is referred to as being "on" another layer or substrate, it can be directly on the other layer or substrate, or intervening layers may also be present. The same reference numerals in different drawings represent the same elements.

Figure 4:
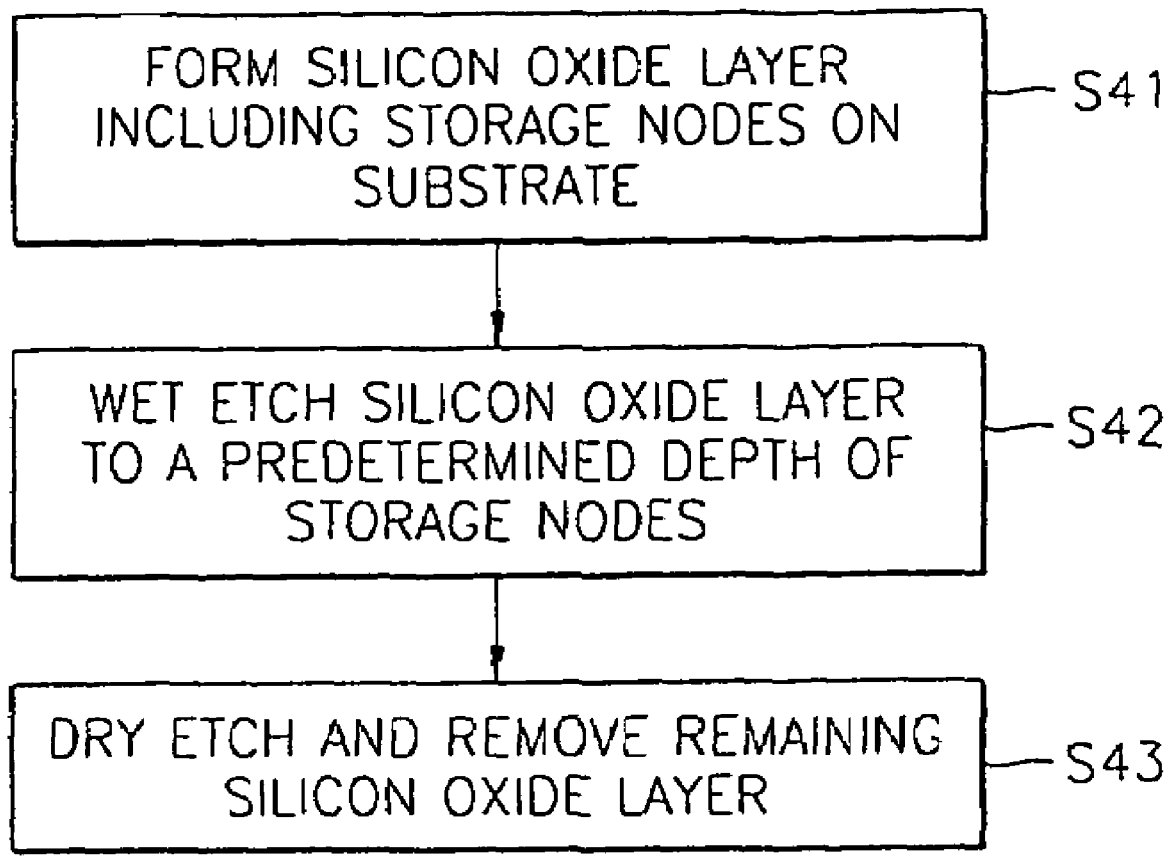
FIG. 4 is a flowchart illustrating a method of manufacturing storage nodes of a semiconductor memory device according to a first embodiment of the present invention.

A first exemplary embodiment of the present disclosure is described with respect to FIG. 4. FIG. 4 is a flowchart illustrating a first embodiment of the present invention. In a method of manufacturing a semiconductor memory device according to the present embodiment, a silicon oxide layer including storage nodes is formed on a substrate in step S41.

Here, the storage nodes may be formed as a stack structure, a fin shape, or a cylindrical shape. In the present embodiment, the storage nodes are cylindrical which facilitates falling due to the increased height and reduced width.

Thereafter, a portion of the silicon oxide layer is removed by wet etching in step S42. Here, wet etching is performed using a buffered oxide etchant ("BOE") solution or a hydrogen fluoride ("HF") solution. The wet etching is the same as that performed in the conventional method; however, the etching amount is different from that in the conventional method. In the conventional method, the silicon oxide layer is completely removed by wet etching. In the present embodiment, only a portion of the silicon oxide layer is removed. Here, the depth to which the silicon oxide layer is etched is determined in consideration of various process conditions, such as the speed of a process and the height of the storage nodes. In general, the silicon oxide layer is preferably etched to a depth that does not cause the storage nodes to fall because of the presence of water between the storage nodes.

Thereafter, the remaining silicon oxide layer is completely removed by dry etching in step S43. It is preferable that dry etching is performed using a volatile material as a catalyst, such as, for example, an alcohol-based material or a carboxyl-based material. More specifically, a mixed gas of anhydrous HF, isopropyl alcohol ("IPA") and vapor is used as a medium for dry etching. Here, anhydrous HF removes the silicon oxide layer. IPA acts as a solvent for HF to promote the reaction between HF and the silicon oxide layer.

Dry etching is performed at a wafer temperature range of about 0 to about 60° C. The flow rate of anhydrous HF is about 100 to about 2,000 sccm, and the flow rate of IPA is about 50 to about 200 sccm.

A rinse and drying process is not necessary after dry etching, because dry etching evaporates and discharges etching reactants and the water present on the surfaces of the storage nodes. Accordingly, the water does not present, so the falling of the adjacent storage nodes and short circuits are prevented. However, compared to wet etching, dry etching has a disadvantage of low throughput. Thus, dry etching alone cannot be efficiently used to remove the silicon oxide layer.

According to the present embodiment where dry etching is performed after wet etching, the storage nodes are prevented from falling. In addition, in the method according to the present embodiment, wet etching is performed with dry etching and the rinse and drying process is not required, so the throughput of the present embodiment is similar to that of the conventional method where only wet etching is performed.

Figure 5:
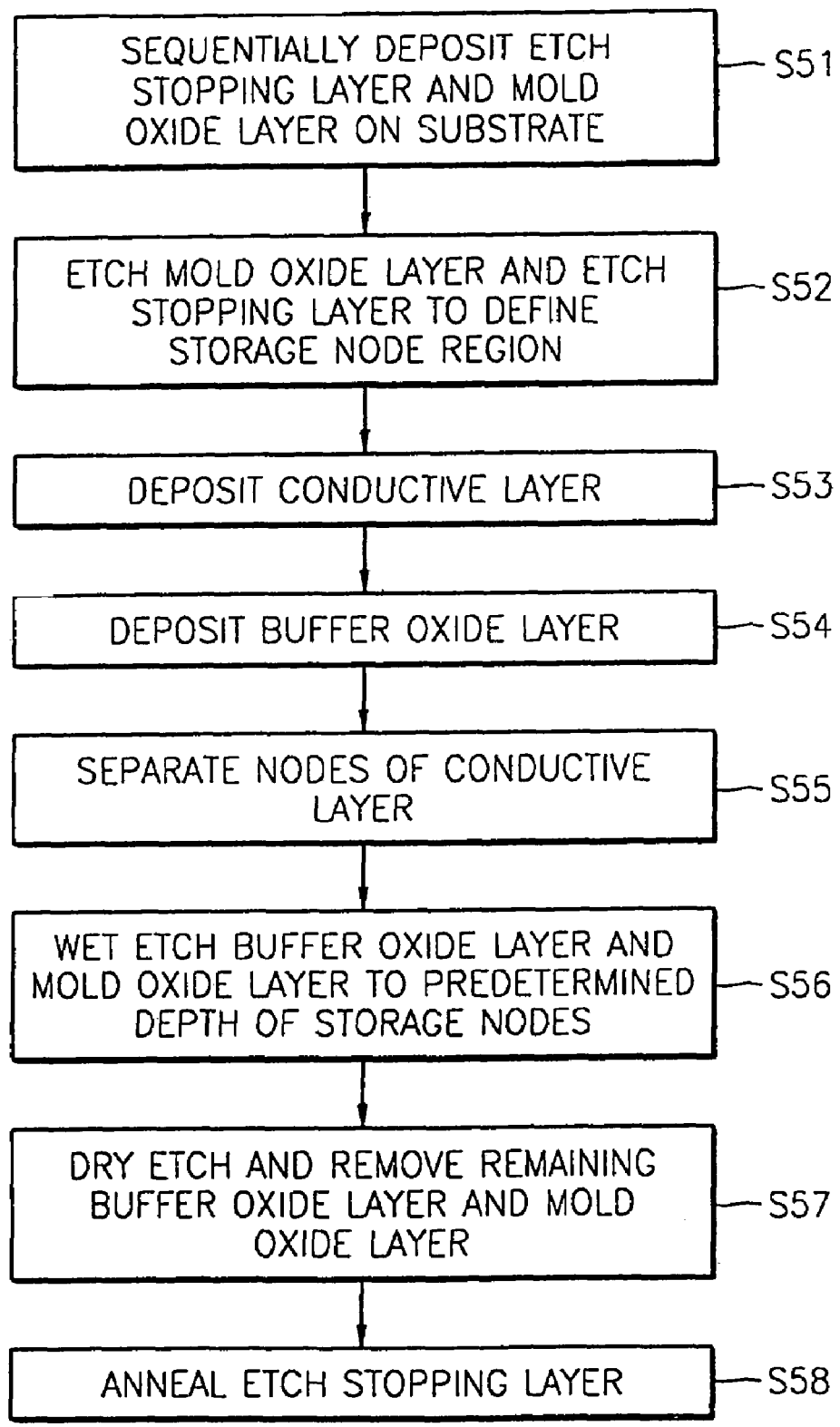
FIG. 5 is a flowchart illustrating a method of manufacturing storage nodes of a semiconductor memory device according to a second embodiment of the present invention.

A second exemplary embodiment of the present disclosure is described with respect to FIGS. 5 and 6A through 6E. FIG. 5 is a flowchart illustrating a method of manufacturing storage nodes of a semiconductor memory device according to a second embodiment of the present invention, and FIGS. 6A through 6E are sectional views illustrating the manufacturing method of FIG. 5.

Figure 6A:
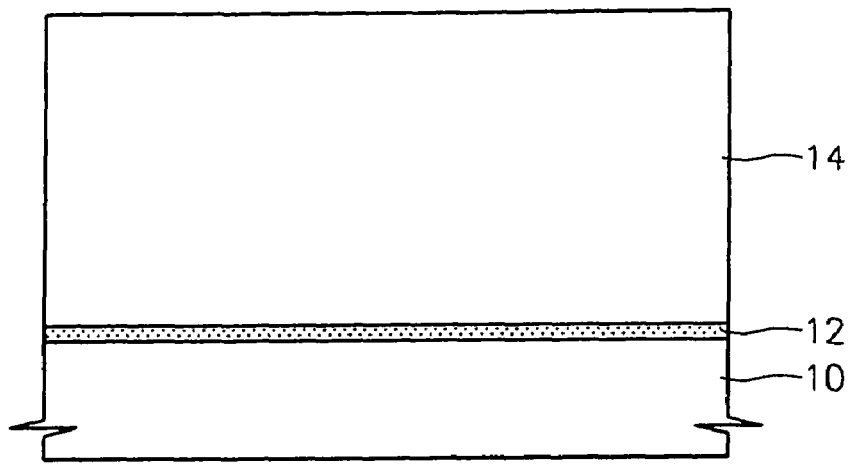
FIGS. 6A through 6E are sectional views illustrating the method of manufacturing storage nodes of a semiconductor memory device according to the second embodiment of the present invention.

Referring to FIGS. 5 and 6A, an etch stopping layer 12 and a mold silicon oxide layer 14 are sequentially deposited on a substrate 10 in step S51. Here, the substrate 10 can be a semiconductor wafer substrate or an interlevel insulating layer including storage node contact plugs (not shown). The etch stopping layer 12 prevents a material formed under the etch stopping layer 12 from being etched when etching the mold silicon oxide layer 14. Here, the etch stopping layer 12 is formed of a material having an excellent etching selectivity to the mold silicon oxide layer 14. An example of the etch stopping layer 12 includes a silicon nitride layer.

For example, the etch stopping layer 12 can be formed to a thickness of about 500 to 1,000 Å, and the mold silicon oxide layer 14 can be formed to a thickness of about 15,000 to about 20,000 Å or higher. Here, the thickness of the mold silicon oxide layer 14 is determined in consideration of the height of storage nodes, which will be formed in subsequent processes.

Figure 6B:
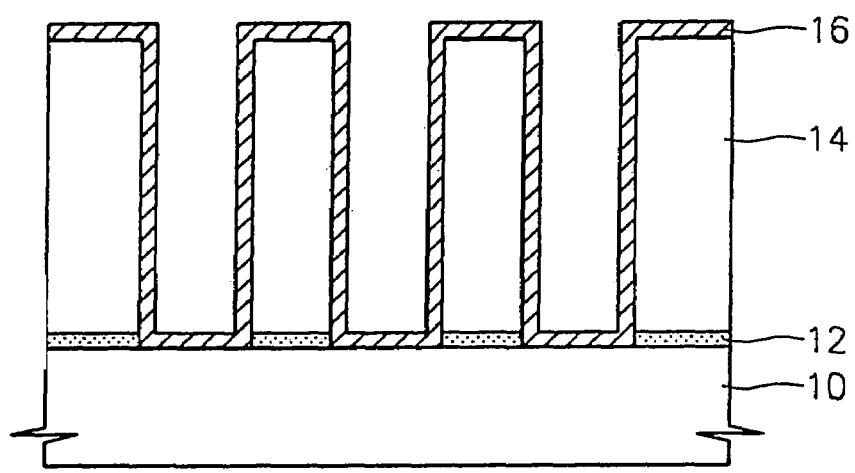

Referring to FIGS. 5 and 6B, the mold silicon oxide layer 14 and the etch stopping layer 12 are selectively etched using a photolithography process and an etching process to define a storage node region in step S52. The storage node region can have the shape of a circle, an oval, or a rectangle when viewed from above, for example. Next, a conductive layer 16 is deposited to a specific thickness on the resultant structure in order to form cylindrical storage nodes in step S53. Here, the conductive layer 16 is formed on the mold silicon oxide layer 14 as well as on a region where the storage nodes are to be formed. The conductive layer 16 is formed, for example, of polysilicon or metal to a thickness of about 100 to about 500 Å.

Figure 6C:
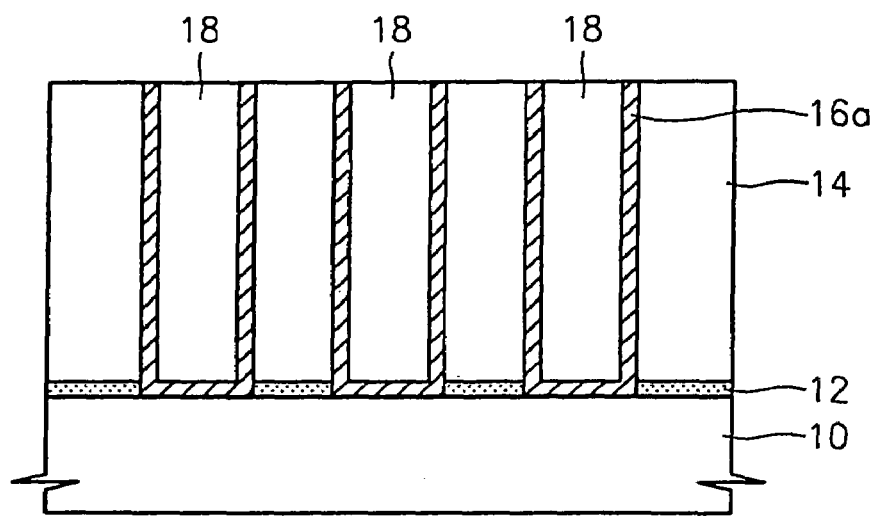

Referring to FIGS. 5 and 6C, a silicon oxide layer 18 serving as a buffer oxide layer is thickly formed on the conductive layer 16 in step S54. Here, the buffer oxide layer 18 completely covers the conductive layer 16. Next, portions of the buffer oxide layer 18 and the conductive layer 16 are removed by a chemical mechanical polishing ("CMP") process or a dry etchback process in step S55. Thus, nodes of the conductive layer 16 are separated so that storage nodes 16a are formed between the mold silicon oxide layers 14 and the buffer oxide layers 18. Although the cylindrical storage nodes 16a are illustrated in the present embodiment, the present invention can be applied to storage nodes having other shapes.

Figure 6D:
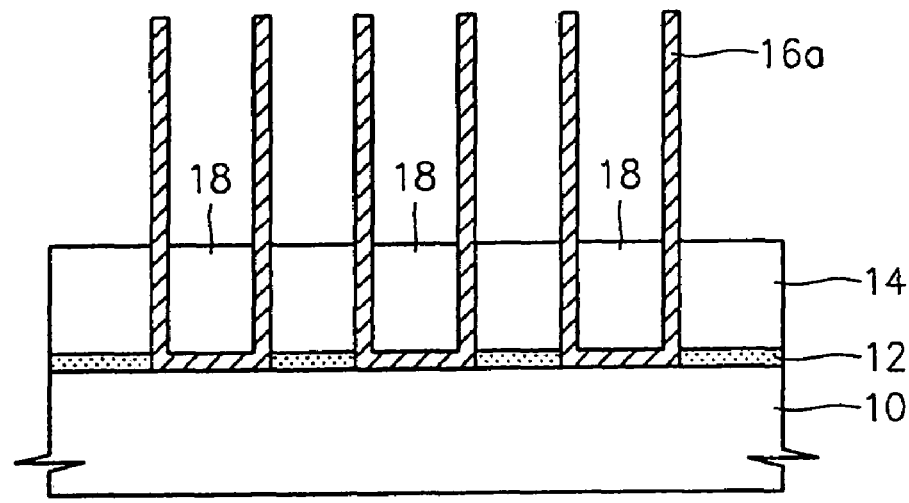

Referring to FIGS. 5 and 6D, the oxide layers, i.e., the mold silicon oxide layer 14 and the buffer oxide layer 18, are etched to a predetermined depth of the storage nodes 16a in step S56. In this case, wet etching is used. For example, the upper portions of the oxide layers 14 and 18 are wet etched using a BOE solution or a HF solution. It is preferable that wet etching is performed to a depth that does not cause the storage nodes 16a to fall because of the presence of water between the storage nodes 16a.

Figure 6E:
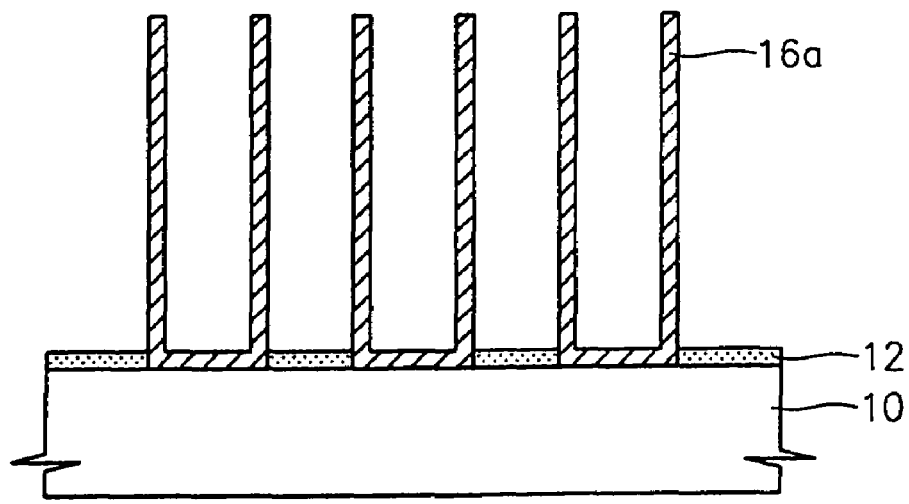

Referring to FIGS. 5 and 6E, the remaining silicon oxide layers 14 and 18 are removed using dry etching in step S57. Here, the dry etching is the same as that of the first embodiment, and thus dry etching will not be described again here.

Figure 3:
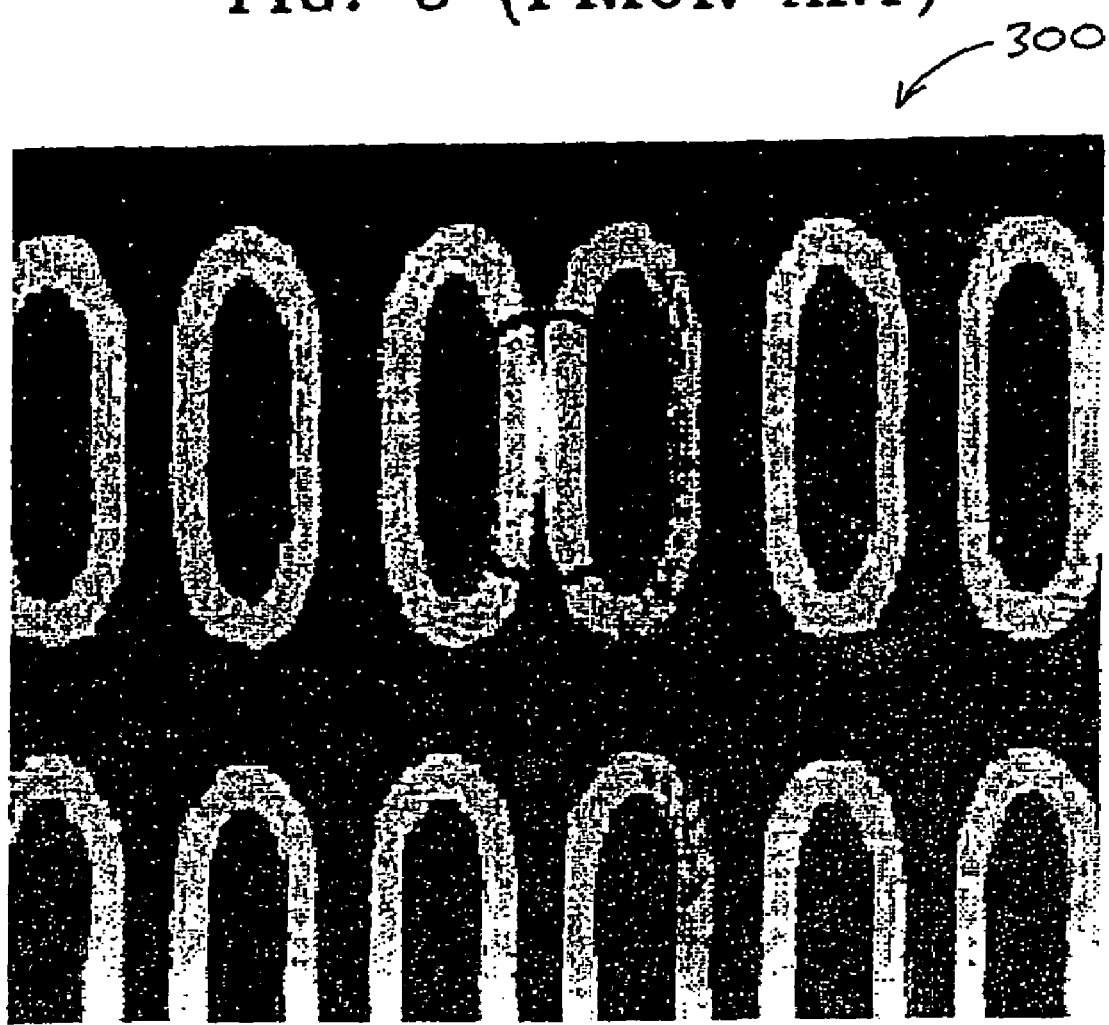
FIG. 3 is a scanning electron microscope ("SEM") photograph illustrating a bridge caused by fallen storage nodes manufactured according to the conventional method.
Figure 7:
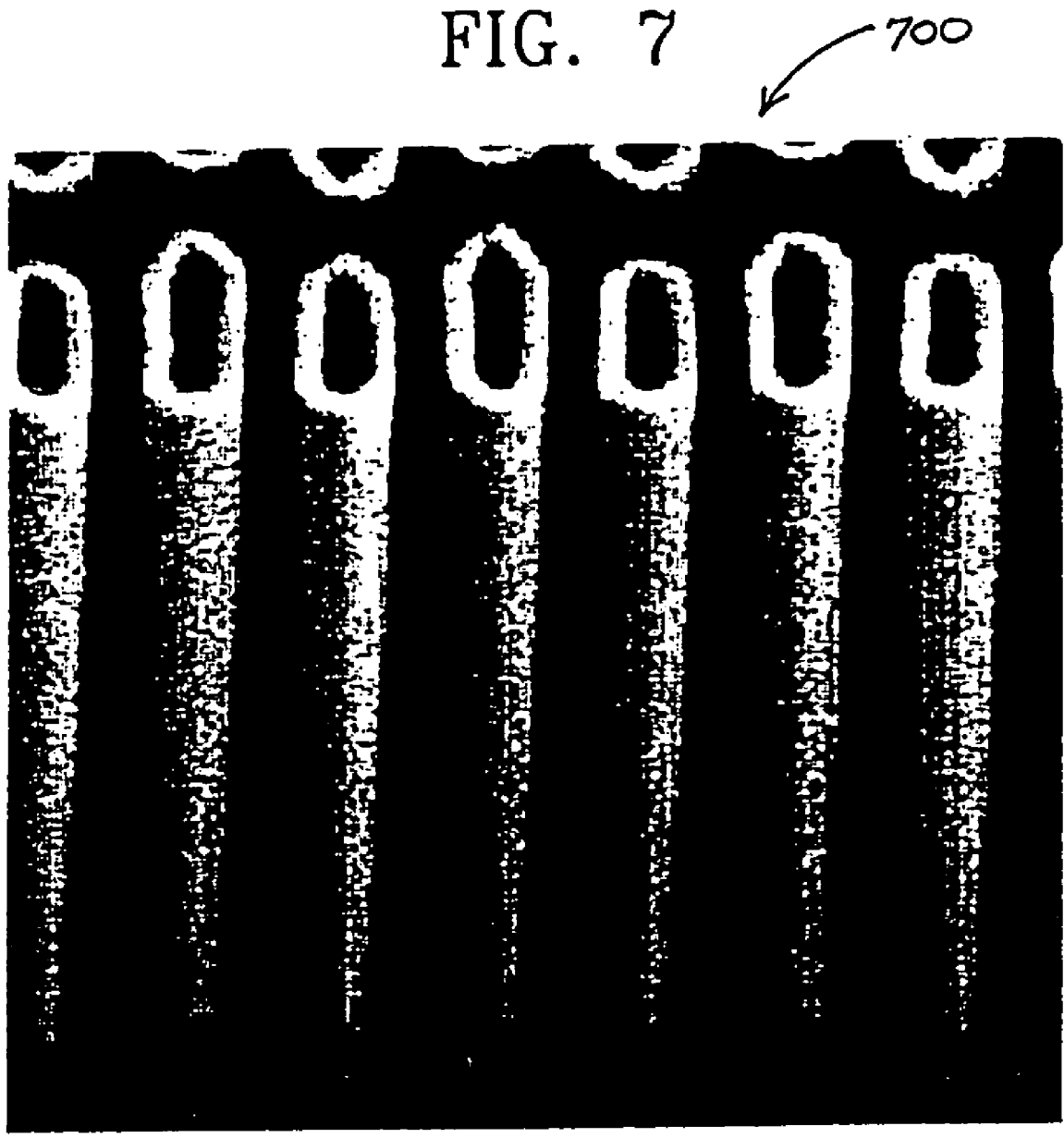
FIG. 7 is an SEM photograph illustrating storage nodes manufactured according to the second embodiment of the present invention.

Turning to FIG. 7, the reference numeral 700 generally indicates a scanning electron microscope ("SEM") photograph illustrating unfallen storage nodes 710, 712, 714, 716, 718 and 720, each having a height of about 18,000 Å, after the mold silicon oxide layer and the buffer oxide layer are removed, according to the present embodiment. Here, unlike in the photograph of FIG. 3, there are no fallen storage nodes in the photograph of FIG. 7.

Referring back to FIG. 5, after the mold silicon oxide layer 14 and the buffer oxide layer 18 are completely removed by dry etching, an annealing process can be additionally performed in step S58. In general, anhydrous HF reacts with the silicon nitride layer acting as the etch stopping layer 12, and thus damage to the etch stopping layer 12 occurs. In the case of performing dry etching after wet etching as in the present embodiment, the time required for dry etching is not very long. When dry etching time is lengthened, severe damage may be caused to the silicon nitride layer. In this case, the annealing process alone cannot fix damaged portions of the silicon nitride layer or completely remove impurities. Accordingly, dry etching alone cannot remove the silicon oxide layer.

It is preferable that the annealing process is performed at a temperature of about 200 to about 300° C.

According to the present invention, a bridge between adjacent storage nodes, caused by fallen storage nodes, can be prevented. In addition, by adding dry etching, a drying process is not necessary, and processes are simplified. Furthermore, throughput is improved, and damage to a lower layer is reduced compared to the case where dry etching alone is used.

While this invention has been particularly shown and described with reference to preferred embodiments thereof, it will be understood by those of ordinary skill in the pertinent art that various changes in form and details may be made therein without departing from the spirit and scope of the invention as defined by the appended claims.

What is claimed is:

1. A semiconductor memory device comprising:
   a substrate;
   a plurality of storage nodes formed on the substrate from a silicon oxide layer, said layer having been substantially removed by wet etching the silicon oxide layer to a predetermined depth of the storage nodes and dry etching the remaining portion of the silicon oxide layer to expose the storage nodes.

2. A semiconductor memory device as defined in claim 1 wherein at least some of said storage nodes are substantially cylindrical and extend axially from the substrate, the wet etching having used at least one of a buffered oxide etchant ("BOE") solution and a hydrogen fluoride ("HF") solution and the dry etching having used a mixed gas of anhydrous HF, isopropyl alcohol ("IPX") and vapor to expose the storage nodes.

3. A semiconductor memory device as defined in claim 1 wherein said dry etching is performed using a volatile material as a catalyst.

4. A semiconductor memory device as defined in claim 3 wherein the catalyst is an alcohol-based material or a carboxyl-based material.

5. A semiconductor memory device as defined in claim 1 wherein said predetermined depth is responsive to process conditions comprising at least one of the speed of a process and the height of the storage nodes, such that said wet etching performed to the predetermined depth does not cause adjacent storage rhodes to fall.

6. A semiconductor memory device as defined in claim 1 wherein:
   said storage nodes are substantially cylindrical;
   said wet etching used at least one of a buffered oxide etchant ("BOE") solution and a hydrogen fluoride ("HF") solution; and
   said dry etching used a mixed gas of anhydrous HF, isopropyl alcohol ("IPA") and vapor to expose the storage nodes.

7. A semiconductor memory device as defined in claim 6 wherein the storage nodes are formed of at least one of polysilicon and metal.

8. A semiconductor memory device as defined in Clam 6 herein the dry etching is performed at a temperature range of about 0° C. to about 60° C.

9. A semiconductor memory device as defined in claim 6 wherein the flow rate of anhydrous HF is in the range of about 100 sccm to about 2,000 scorn.

10. A semiconductor memory device as defined in claim 6 wherein the flow rate of IPA is in the range of about 50 sccm to about 200 sccm.

11. A semiconductor memory device as defined in claim 6 wherein the wet etching is performed to a depth that does not cause adjacent storage nodes to fall.

12. A semiconductor memory device comprising:
    a plurality of storage node contact plugs formed by sequentially depositing an etch stopping layer and a mold oxide layer on an interlevel insulating layer;
    at least one storage node region formed by sequentially etching the mold oxide layer and the etch stopping layer, depositing a conductive layer on the storage node region and the mold oxide layer, and depositing a buffer oxide layer on the conductive layer;

a plurality of storage nodes formed by etching the buffer oxide layer and the conductive layer by separating nodes of the conductive layer, wet etching the buffer oxide layer and the mold oxide layer to a predetermined depth of the storage nodes, and removing the remaining portions of the buffer oxide layer and the mold oxide layer by dry etching to expose the storage nodes.

13. A semiconductor memory device as defined in claim 12 wherein said wet etching comprised using at least one of a buffered oxide etchant ("BOE") solution and a hydrogen fluoride ("HF") solution and said dry etching comprised using a mixed gas of anhydrous HF, isopropyl alcohol ("IPA") and vapor to expose the storage odes.

14. A semiconductor memory device comprising:
    an etch stopping layer and a mold oxide layer sequentially deposited on an interlevel insulating layer including storage node contact plugs;
    a storage node region defined by sequentially etching the mold oxide layer and the etch stopping layer;
    a conductive layer deposited on the storage node region and the mold oxide layer;
    a buffer oxide layer deposited on the conductive layer; storage nodes formed by etching the buffer oxide layer and the conductive layer to separate nodes of the conductive layer;
    a first depth of the storage nodes reached by wet etching the buffer oxide layer and the mold oxide layer in response to process conditions; and
    a second depth of the storage nodes reached by dry etching to remove the remaining portions of the buffer oxide layer and the mold oxide layer to expose the storage nodes.

15. A semiconductor memory device as defined in claim 14 wherein the second depth dry etching is performed using a volatile material as a catalyst.

16. A semiconductor memory device as defined in claim 15 wherein the catalyst is at least one of an alcohol-based material and a carboxyl-based material.

17. A semiconductor memory device as defined in claim 14 wherein said first depth is responsive to process conditions comprising at least one of the speed of a process and the height of the storage nodes, such that said wet etching performed to the first depth does not cause adjacent storage nodes to fall.

18. A semiconductor memory device as defined in claim 14 wherein the etch stopping layer is annealed after the dry etching.

19. A semiconductor memory device as defined in claim 14 wherein the conductive layer is formed of polysilicon or metal.

20. A semiconductor memory device as defined in claim 14 wherein the storage nodes are cylindrical.

* * * * *